(12) United States Patent
Boettiger et al.

(10) Patent No.: US 7,280,279 B2
(45) Date of Patent: Oct. 9, 2007

(54) APPARATUS AND METHOD FOR MANUFACTURING TILTED MICROLENSES

(75) Inventors: Ulrich C. Boettiger, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/328,158

(22) Filed: Jan. 10, 2006

(65) Prior Publication Data
US 2006/0152813 A1    Jul. 13, 2006

Related U.S. Application Data

(63) Continuation of application No. 10/926,360, filed on Aug. 26, 2004, now Pat. No. 7,012,754, and a continuation-in-part of application No. 10/857,948, filed on Jun. 2, 2004.

(51) Int. Cl.
 *G02B 27/10* (2006.01)
(52) U.S. Cl. ...................................... 359/619
(58) Field of Classification Search ............... 359/619, 359/620, 626, 528; 264/1.1, 1.32, 1.7, 2.7; 348/340
See application file for complete search history.

(56) References Cited

U.S. PATENT DOCUMENTS

| 5,439,621 | A | * | 8/1995 | Hoopman ................... 264/1.7 |
| 5,940,557 | A | | 8/1999 | Harker |
| 6,063,527 | A | | 5/2000 | Nishikawa et al. |
| 6,187,485 | B1 | | 2/2001 | Matsushima et al. |
| 6,211,916 | B1 | | 4/2001 | Hawkins et al. |
| 6,294,313 | B1 | | 9/2001 | Kobayashi et al. |
| 6,297,911 | B1 | | 10/2001 | Nishikawa et al. |
| 6,495,813 | B1 | | 12/2002 | Fan et al. |
| 6,618,201 | B2 | | 9/2003 | Nishikawa et al. |
| 6,674,940 | B2 | | 1/2004 | Kroupenkine |
| 2003/0044701 | A1 | | 3/2003 | Boettiger et al. |

* cited by examiner

*Primary Examiner*—Alicia M Harrington
(74) *Attorney, Agent, or Firm*—Dickstein Shapiro LLP

(57) ABSTRACT

Asymmetrical structures and methods are used to adjust the orientation of a microlens for a pixel array. The asymmetrical structures affect volume and surface force parameters during microlens formation. Exemplary microlens structures include an asymmetrical microlens frame, base, material or a combination thereof to affect the focal characteristics of the microlens. The asymmetrical frame alters the microlens flow resulting from the heating of the microlens during fabrication such that orientation of the microlens relative to an axis of the imager can be controlled.

16 Claims, 8 Drawing Sheets

APPARATUS AND METHOD FOR MANUFACTURING TILTED MICROLENSES

CROSS-REFERENCE TO RELATED APPLICATIONS

This application is a Continuation Application of application Ser. No. 10/926,360, filed Aug. 26, 2004 now U.S. Pat. No. 7,012,754 the entire disclosure of which is hereby incorporated by reference.

FIELD OF THE INVENTION

The invention relates to fabrication of microlens structures for image capture or display systems and, more specifically, to structures and methods of manufacturing of microlens arrays for solid state imager systems.

BACKGROUND OF THE INVENTION

Solid state imagers, including charge coupled devices (CCD) and CMOS sensors, have been used in photo imaging applications. A solid state imager circuit includes a focal plane array of pixel cells, each one of the cells including either a photogate, photoconductor or a photodiode having a doped region for accumulating photo-generated charge. Microlenses are placed over imager pixel cells. A microlens is used to focus light onto the initial charge accumulation region. A single microlens may have a polymer coating, which is patterned into squares or circles provided respectively over the pixels which are then heated during manufacturing to shape and cure the microlens.

Use of microlenses significantly improves the photosensitivity of the imaging device by collecting light from a large light collecting area and focusing it on a small photosensitive area of the sensor. The ratio of the overall light collecting area to the photosensitive area of the sensor is known as the fill factor of the pixel.

The use of smaller sized microlens arrays is increasingly important in microlens optics. One reason for increased interest in reducing the size of microlenses is the increased need to reduce the size of imager devices and increase imager resolution. However, reductions in pixel sizes result in a smaller charge accumulation area in individual pixels in the array. Reduced sizes of pixels result in smaller accumulated charges which are read out and processed by signal processing circuits.

As the size of imager arrays and photosensitive regions of pixels decreases, it becomes increasingly difficult to provide a microlens capable of focusing incident light rays onto the photosensitive regions. This problem is due in part to the increased difficulty in constructing a smaller microlens that has the optimal focal characteristics for the imager device process and that optimally adjusts for optical aberrations introduced as the light passes through the various device layers. Also, it is difficult to correct possible distortions created by multiple regions above the photosensitive area, which results in increased crosstalk between adjacent pixels. "Crosstalk" can result when off-axis light strikes a microlens at an obtuse angle. The off-axis light passes through planarization regions and a color filter, misses the intended photosensitive region, and instead strikes an adjacent photosensitive region.

Microlens shaping and fabrication through heating and melting microlens materials becomes increasingly difficult as microlens structures decrease in size. Previous approaches to control microlens shaping and fabrication do not provide sufficient control to ensure optical properties such as focal characteristics or other parameters needed to provide a desired focal effect for smaller microlens designs. Consequently, imagers with smaller sized microlenses have difficulty in achieving high color fidelity and signal/noise ratios.

BRIEF SUMMARY OF THE INVENTION

Exemplary embodiments of the present invention provide easily manufactured microlenses which can be used in an imager or display device. The microlens structures of the invention are formed by employing asymmetrical frame structures of a first material that affect volume and surface force parameters during microlens formation. The asymmetrical frame structures affect the orientation of at least one microlens of a second material with respect to at least one axis of the imager or the display device (for example, the horizontal axis of the imager). The asymmetrical frame structures alter the microlens flow resulting from the heating of the microlenses during fabrication, such that the microlens orientation with respect to at least one axis of the imager or the display device can be controlled. Also provided are methods of forming a microlens structure by (i) forming an asymmetrical frame structure over a substrate and (ii) adding a lens material into the asymmetrical frame structure to form at least one tilted microlens.

These and other features representative of various embodiments of the invention will be more readily understood from the following detailed description of the invention, which is provided in connection with the accompanying drawings.

DETAILED DESCRIPTION OF PREFERRED EMBODIMENTS

Figure 1:
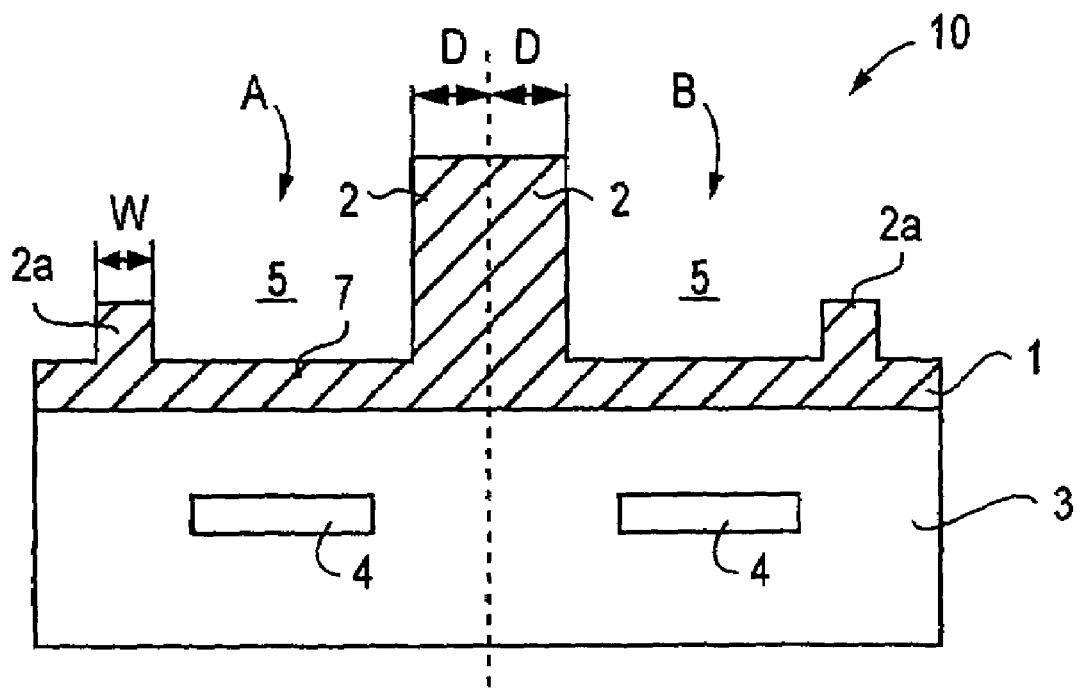
FIG. 1 illustrates a cross-sectional view of a portion of an asymmetrical frame for microlens structures constructed in accordance with an exemplary embodiment of the invention.

According to the invention, the focal characteristics of a microlens and its orientation can be adjusted by forming boundary walls around lens materials to contain and/or limit the outward flow of lens material. This adjusts microlens flow behavior by, for example, increasing the height of the microlens or defining a perimeter of the microlens structures. Boundary walls can be formed by forming cavities or frame sidewalls with microlens material deposited therein. Post-flow microlens orientation can also be adjusted or affected by use of asymmetrical structures formed within the microlens materials (for example, a microlens base within a microlens material) that change flow behavior of the microlens during microlens flow processing (e.g., altering the orientation of the microlens from a planar layer or a microlens cavity). In this manner, asymmetrical microlenses can be formed with asymmetrical structures to provide focal points that are not directly underneath a microlens as needed for a particular design.

The orientation and optical properties of a microlens can be adjusted independently of other microlens design parameters by using structures, materials and/or fabrication processing techniques to affect the microlens melting or flow behavior during fabrication. As used in this application, a positive microlens includes a microlens with an inner portion extending above a layer or above a microlens cavity (e.g., a convex microlens) and a negative microlens includes a microlens that does not extend outside the microlens cavity or below the layer (e.g., a concave microlens).

Exemplary embodiments provide an alteration of the balance of surface and volume related forces, by creating a microlens within at least one asymmetrical enclosure or frame; this results in an altered orientation of the microlens (after heating and subsequent flowing of melted microlens material). A variety of asymmetrical enclosures or frame shapes can be used to create the microlens with a desired optical property, focal characteristics and/or desired orientation. For example, by providing an asymmetrical frame structure, the orientation of the reflowed microlens can be controlled so that the focal spot of the microlens can be shifted to the center of the light sensitive area of interest.

As described below, microlens material is heated and flowed during microlens fabrication by melting the microlens material, resulting in a flow of the deposited material into a desired asymmetrical shape. For example, a trapezoidal block of microlens material formed on a planar surface will assume a tilted semi-spherical shaped microlens after being heated to 170° C. to 180° C. (depending on resist) due to the melting and flowing of the microlens material. The term "flow", "flowing" or "reflowing" refers to a change in shape of a material which is heated and melts thereby producing a material flow or shape alteration in the material caused by heating or other similar process. "Flow" is an initial melting and "reflow" is a subsequent melting of an asymmetrical frame or microlens material that has been previously flowed.

Referring now to the drawings, where like elements are designated by like reference numerals, FIG. 1 illustrates a cross-sectional view of an asymmetrical microlens frame 10 having adjacent openings 5, which will be subsequently filled with lens material to form a tilted semi-spherical microlens. The asymmetrical frame 10 may be employed, for example, in a two-way shared pixel design application wherein two photosensitive elements (for example, two photodiodes) are grouped together to help pixel shrinkage and allow more packing of logic circuits. The asymmetrical frame 10 is formed over a substrate 3 having photosensor devices 4 therein. Asymmetrical frame regions A and B are each defined by frame openings 5, which in turn are formed within a planar layer 1 of a first material formed over the substrate 3 using methods well known in the art, such as etching or patterning. Frame openings 5 are defined by frame opening sidewalls 2, 2a and a flat floor portion 7. Each opening sidewall 2 of each frame opening 5 has a first width "D," which is a greater than a second width "w" characterizing the opening sidewalls 2a. For the purposes of the present invention, the term "asymmetrical structure" is defined as a spatial structure having a geometrical configuration that enables the formation of a tilted microlens structure by methods of the present invention.

Figure 2:
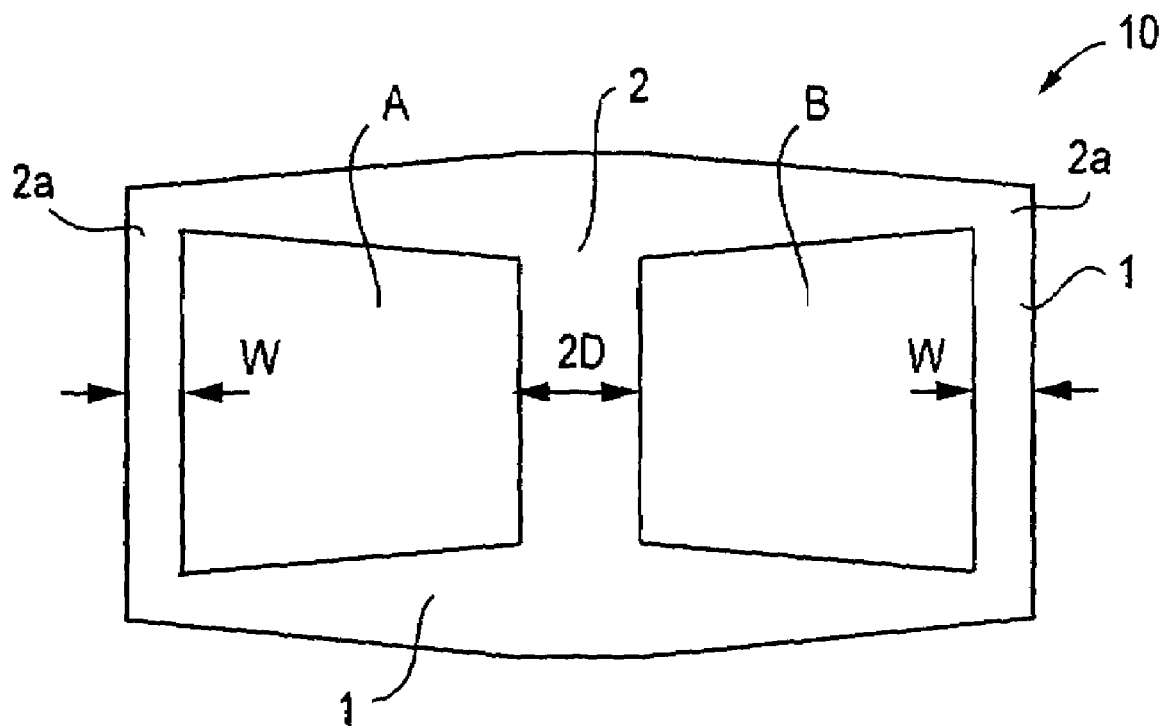
FIG. 2 illustrates a top view of the portion of the asymmetrical frame of FIG. 1.
Figure 3:
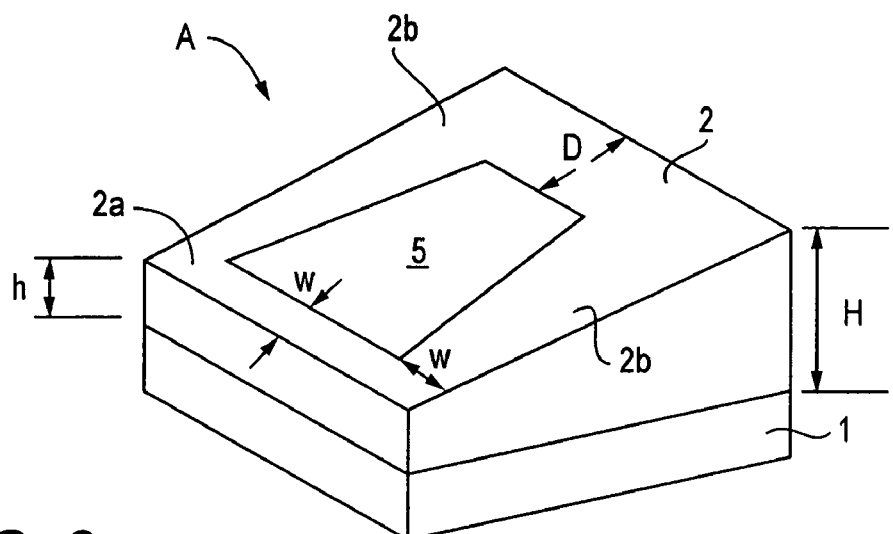
FIG. 3 illustrates a perspective view of a portion of the asymmetrical frame of FIG. 1.

FIG. 2 illustrates a top view of the asymmetrical frame regions A, B of the asymmetrical frame 10 of FIG. 1, illustrating frame openings 5 formed within the planar layer 1 of the first material. As shown in FIG. 2, frame openings 5 of regions A, B have an asymmetrical trapezoidal shape. An elevational perspective view of the asymmetrical frame region A of FIG. 2 is illustrated in FIG. 3. Sidewall 2 of the frame opening 5 has a first height "H" of about 0.5 microns that slopes down laterally on both sides towards the sidewall 2a, which has a second height "h" of about 0.2 microns. The width of the sidewalls may also vary. For example, as shown in FIG. 3, sidewall 2 has a first width "D" of about 0.25 to 1.0 microns, whereas the width of sidewalls 2b decreases from the first width "D" to a second width "w" of about 0.2 to 0.5 microns. In this manner, the four sidewalls 2, 2b, 2a, 2b and floor portion 7 define a spatial trapezoidal region within the asymmetrical frame opening 5 of the frame region A. As discussed below, microlens material is deposited into the asymmetrical frame opening 5 and then heated to flow or melt into a desired tilted microlens.

Figure 4:
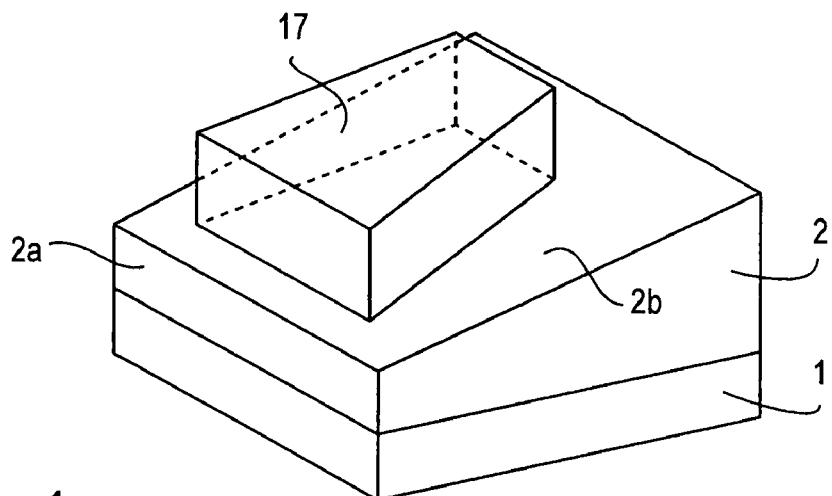
FIG. 4 illustrates a perspective view of the portion of the asymmetrical frame of FIG. 3 with lens material before heating.
Figure 5:
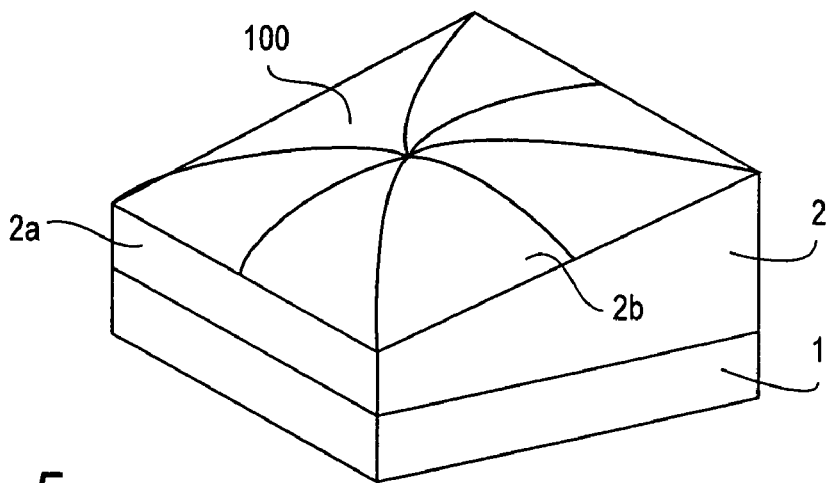
FIG. 5 illustrates a perspective view of the portion of the asymmetrical frame of FIG. 3 with lens material after heating.

Reference is now made to FIG. 4. A deposited microlens layer 17 is formed within the frame opening 5 of the frame region A. The microlens layer 17 is formed of a second material which may be similar to, or different from, the first material of the frame region A. Thus, the microlens layer 17 may be formed by coating the substrate 3 with positive resist 17 (if convex tilted microlenses are desired) to form an asymmetrical structure following the shape of the asymmetrical frame opening 5. FIG. 5 illustrates the structure of FIG. 4 after reflow of the deposited microlens layer 17, wherein the microlens layer 17 melts and flows such that it assumes a tilted shape.

Figure 6:
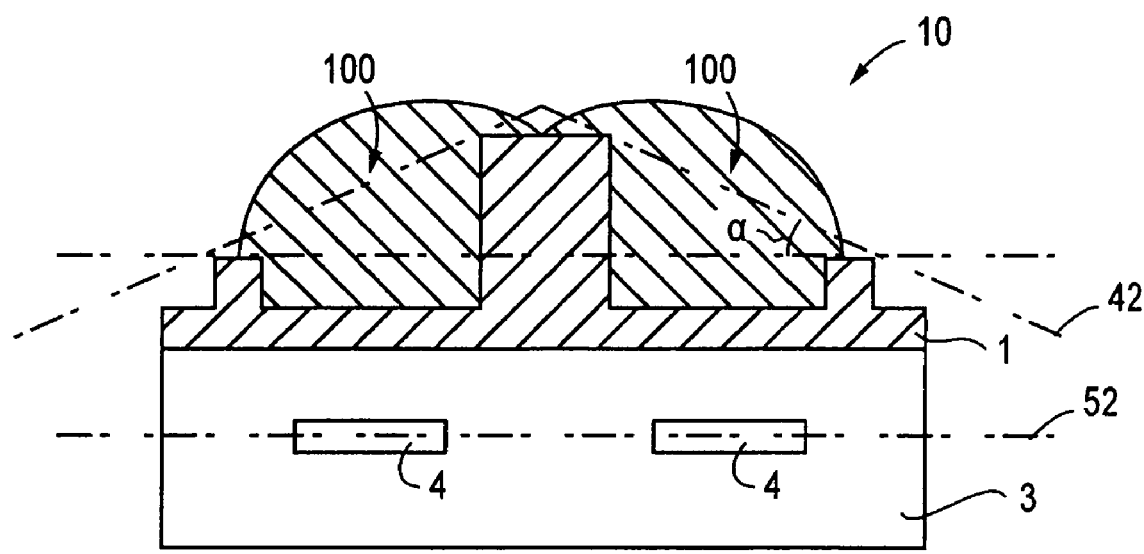
FIG. 6 illustrates a cross-sectional view of a portion of a microlens structure fabricated with the asymmetrical frame of FIG. 1 and with lens material after heating.
Figure 7:
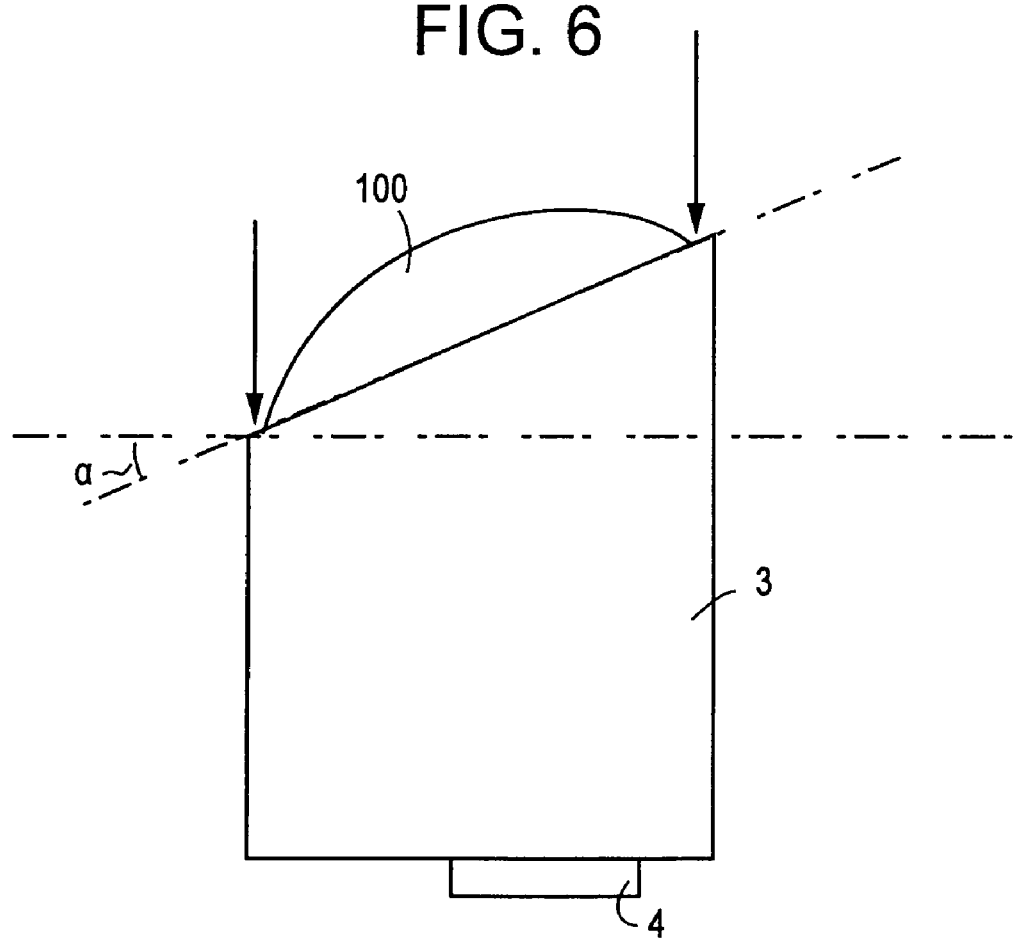
FIG. 7 is a partial cross-sectional view of the microlens structure of FIG. 6.

As illustrated in FIGS. 6 and 7, the orientation of resulting reflowed semi-spherical microlens 100 is tilted, in that axis 42 which is tangential to the highest and lowest points of the sidewalls 2, 2a forms an angle "α" different than a zero degree angle with horizontal axis 52 of the substrate 3. In this manner, tilted microlenses can be formed with an orientation independent of the size of the microlens. For example, the tilted microlenses may have an orientation that allows their focal spot to shift to a target location (a photosensitive element such as a photodiode, for example). By providing the two tilted microlenses as part of a two-way shared pixel layout, it is possible to shift the focal point of each of the microlenses to the targeted device (i.e., the photosensor device 4). In addition, the two targeted devices can be placed closer together, allowing more pixel area for logic circuitry. Further, the two microlenses may be formed over only one photosensitive element (for example, over the left side photosensor device 4 of FIG. 8). Of course, in such case, the right side microlens 100 must be tilted more relative to the horizontal axis of the photodiode 4 (and also relative to the left side microlens 100). Moreover, by controlling the degree of tilt relative to a photosensitive element of the imager, more freedom in the design of the photosensitive element is permitted, since the photosensitive design is not limited to the pixel center, and the focal point of the tilted microlens can be shifted to where the photosensitive element is placed within the pixel.

Figure 8:
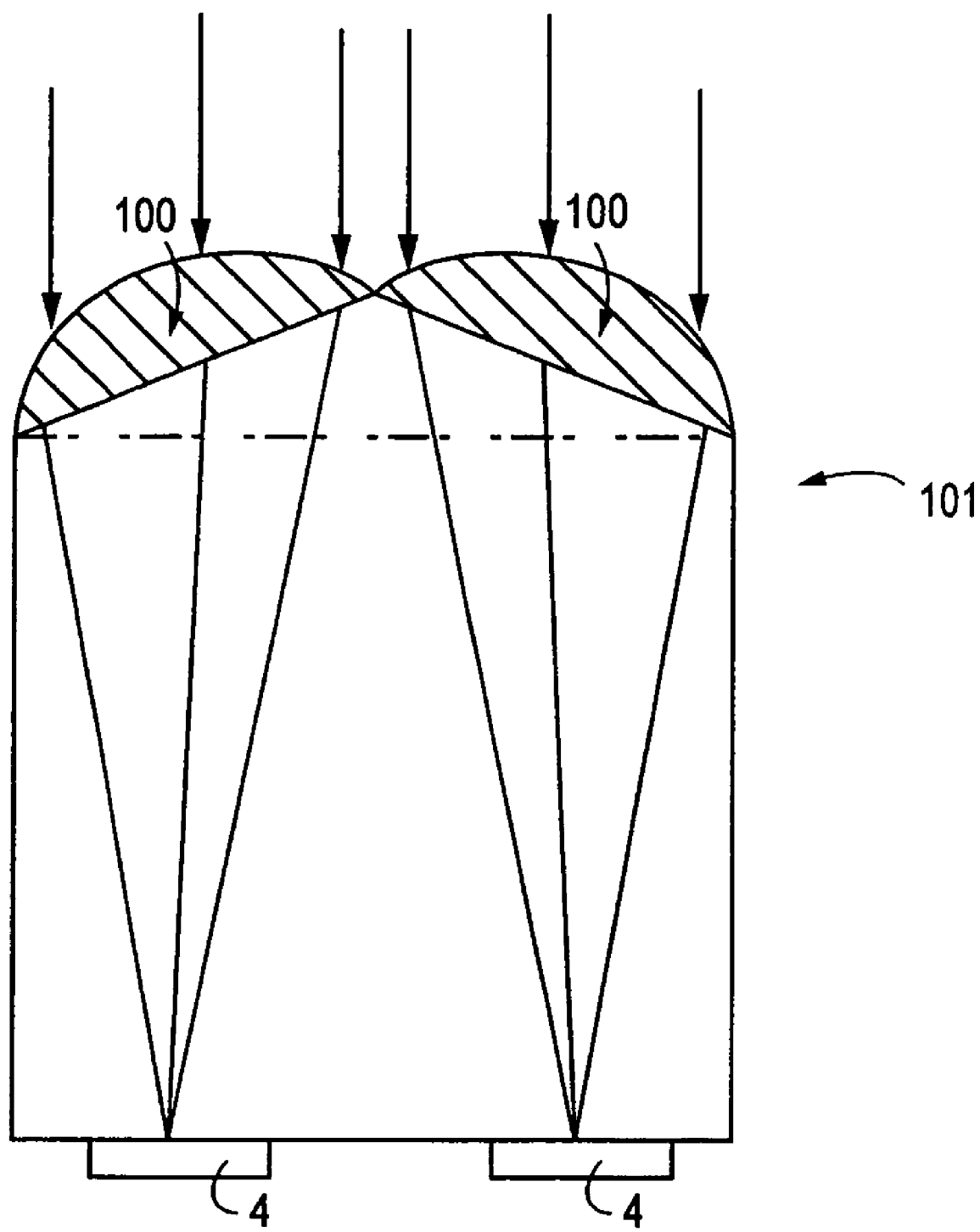
FIG. 8 is a schematic cross-sectional view of the microlens structure of FIG. 6.

FIG. 8 schematically illustrates two tilted convex shaped microlenses 100 formed as described above and as part of a two-way shared pixel 101 comprising two photodiodes 4. The orientation of the tilted microlens, such as the tilted microlens 100 of FIG. 8, as well as the dimensions, shape, volume of lens frame opening (e.g., opening 5), focal length and other focal characteristics in the embodiments that use asymmetrical frames are determined by one or more microlens and imager design parameters including: (1) the distance, width or size of the photosensor 4 underneath the asymmetrical frame opening 5 where the microlens focuses light; (2) the viscosity of the microlens material used to form the microlenses during heating; (3) the sidewall dimensions of the asymmetrical structures or frame opening (e.g., the height and width of the sidewall 2) that affect microlens formation; (4) the alterations in flow behavior of the microlens material resulting from microlens structures affecting microlens material flow behavior during heating; (5) the effects of pre-heating or pre-flow treatment of frame or microlens materials; (6) the desired approximate orientation of the microlens structure after heating of the microlens material is completed; and (7) the effects of a base layer within microlens material that alters flow properties of the microlens material.

Pre-flow treatment of asymmetrical frame or microlens materials can include UV exposure which cross-links the material resulting in less flow and better shape retention of "as printed" microlens shapes. Reflow properties of microlens materials, asymmetrical frames structures receiving microlens material and microlens base layers embedded in microlens material are determined by initial polymer material properties of microlens material, frame opening structures and/or microlens base layers, among others. Also, temperature profile over time for reflow, pre-flow treatment of material and pre-bake of microlens, frame or layer materials (or a combination thereof) at temperatures below glass transition temperatures for a specified time that tends to harden a material so treated. Ultraviolet (UV) or light exposure before reflow can affect the viscosity of microlens material or frame material during flow reflow processing. Pre-baking results in less reflow and better "as printed" shape retention of microlens material, material which asymmetrical frame openings are formed into (e.g., planar layer 1) or both.

Figure 9:
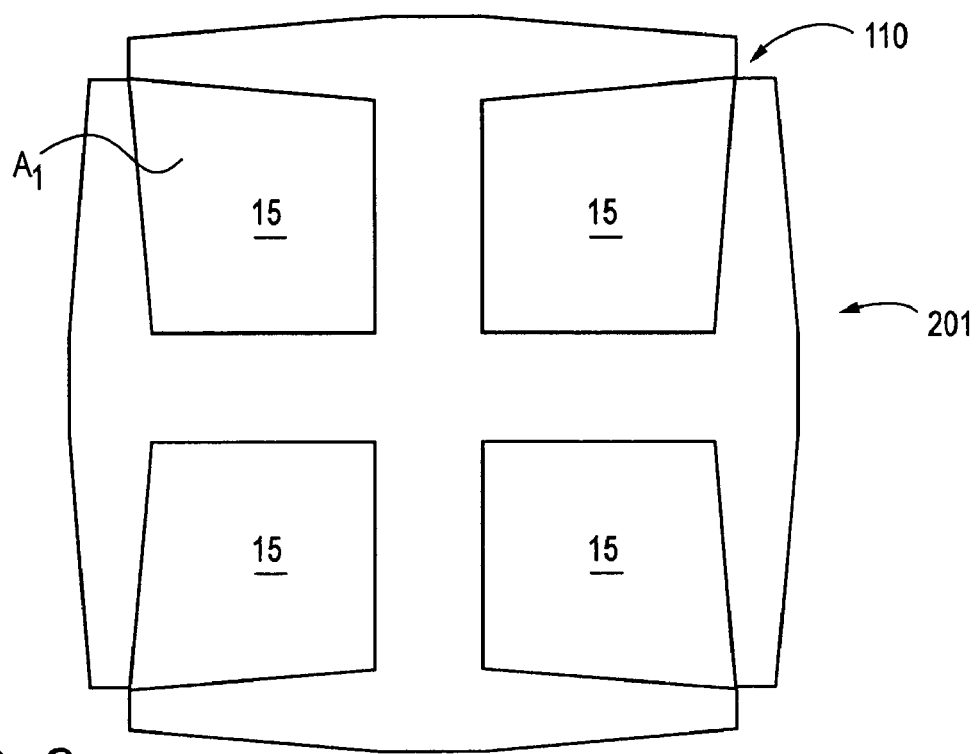
FIG. 9 illustrates a top view of a portion of an asymmetrical frame for microlens structures constructed in accordance with another exemplary embodiment of the invention.
Figure 10:
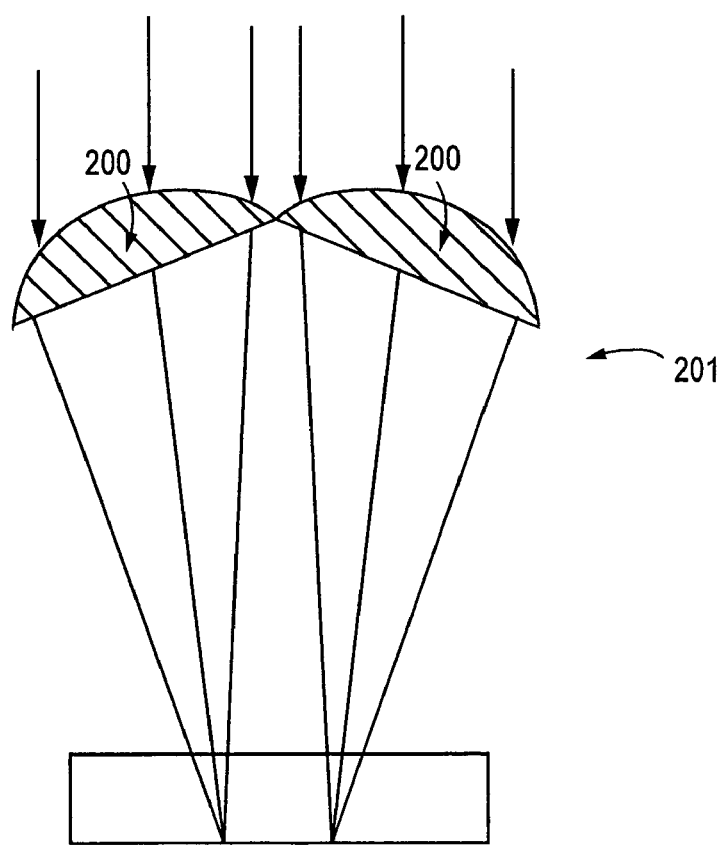
FIG. 10 is a schematic cross-sectional view of a microlens structure fabricated with the frame of FIG. 9.

Asymmetrical frame opening 5 can be designed with a variety of sidewalls having different profiles that affect the microlens material deposited and flowed within the frame opening 5 and ultimately their orientation within various pixel designs. For example, FIG. 9 illustrates another embodiment of the present invention, according to which four asymmetrical frame openings 15 are formed as part of a four-way shared pixel design 201. Each of the asymmetrical frame openings 15 may be similar to, or different from, the asymmetrical frame opening 5 to allow a tilted microlens, such as convex shaped tilted microlens 200 of FIG. 10, to be formed after reflow. In this manner, asymmetrical microlenses can be formed with asymmetrical frame openings to provide focal points that are not directly underneath a microlens if needed for a particular design. By providing the four tilted microlenses as part of a four-way shared pixel layout, it is possible to shift the focal point of each of the microlenses to the targeted device (i.e., the photosensor device 4). In addition, the targeted devices can be placed closer together, allowing more pixel area for logic circuitry. Further, the four microlenses 200 may be formed over only one photosensitive element (for example, over the left side photosensor device 4 of FIG. 10). Of course, in such case, some of the microlenses 200 must be tilted more relative to the horizontal axis of the photodiode 4 and also relative to the other microlenses. Moreover, by controlling the degree of tilt relative to a photosensitive element of the imager, more freedom in the design of the photosensitive element is permitted, since the photosensitive design is not limited to the pixel center, and the focal point of the tilted microlenses can be shifted to where the photosensitive element is placed within the pixel.

Figure 11:
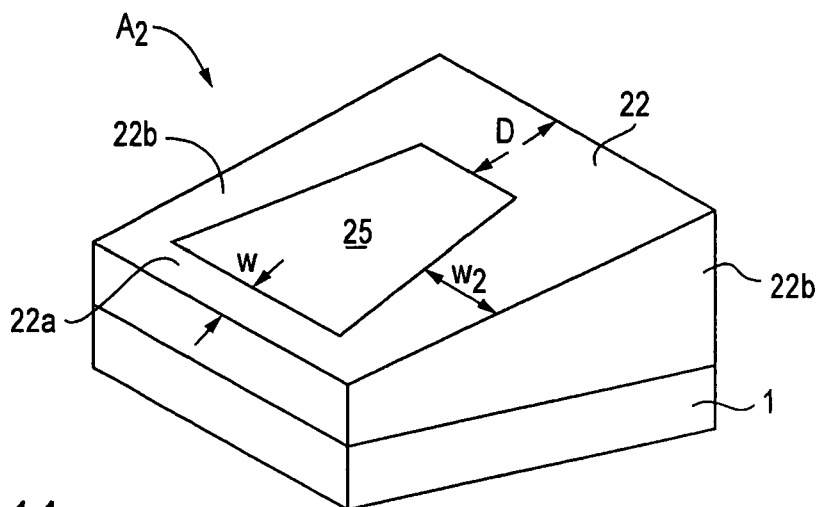
FIG. 11 is a perspective view of a portion of an asymmetrical frame for microlens structures constructed in accordance with another exemplary embodiment of the invention.
Figure 12:
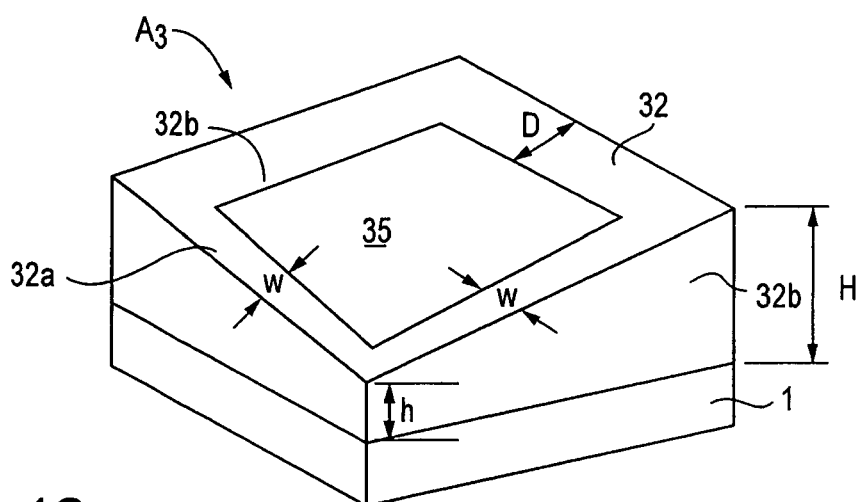
FIG. 12 is a perspective view of another portion of an asymmetrical frame for microlens structures constructed in accordance with yet another exemplary embodiment of the invention.
Figure 13:
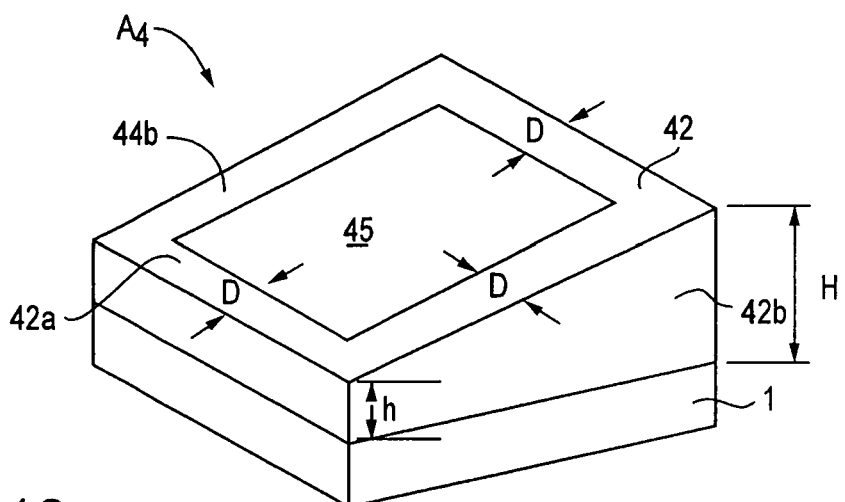
FIG. 13 is a perspective view of a portion of an asymmetrical frame for microlens structures constructed in accordance with yet another exemplary embodiment of the invention.

FIGS. 11-13 illustrate exemplary embodiments of additional asymmetrical frame openings 25, 35, 45 formed of sidewalls having various thicknesses and widths, which are selected so that the flow or reflow behavior of a microlens material during heating results in different microlens orientations after flowing or reflowing. For example, FIG. 11 illustrates a perspective view of asymmetrical frame opening 25 having sidewalls 22, 22a and 22b with similar heights relative to the floor portion of the planar layer 1. However, the width of the sidewalls differs. As shown in FIG. 11, sidewall 22 has a constant first width "D," sidewall 22a has a constant second width "w" which is different from the first width "D" and sidewalls 22b each have a varying width "W2" which decreases from the first width "D" to the second width "w." The asymmetrical frame opening 25 may be part of any desired layout, for example, of a two-way shared diode layout.

FIG. 12 illustrates asymmetrical frame opening 35 defined by sidewalls 32, 32a and 32b having varying heights and varying widths. As shown in FIG. 12, sidewall 32 and one of sidewalls 32b have a constant height "H" and a constant width "D," whereas the other sidewall 32b and sidewall 32a have a varying height (from "H" to "h") and a varying width (from "D" to "w"). FIG. 13 illustrates another exemplary embodiment of the present invention, according to which asymmetrical frame opening 45 is defined by sidewalls 42, 42a and 42b. Sidewalls 42a and 42 have constant heights "H" and "h," respectively, and constant width "D." However, sidewalls 42b have a varying height from "H" to "h" but constant width "D." The asymmetrical frame openings 35, 45 may be part of any desired layout, for example, of a two-way or four-way shared diode layout. Other asymmetrical shapes and configurations can be used to adjust flow behavior of lens material including other asymmetrically shaped sidewalls or containing structures of lens material.

A frame sidewall can be further designed based on a three-dimensional model of the effects of varying multiple microlens structure design parameters including frame opening (e.g., opening 5) or volume affecting structures to design an asymmetrical frame opening volume, floor and sidewalls that suitably alter microlens material flow behavior towards a desired microlens shape. A three-dimensional profile of asymmetrical frame opening 5 can be designed based on design layout as well as adjusting photolithography tool characteristics. For example, three-dimensional profiles can be obtained as the result of a limited resolution of a photolithography tool and process used to print or form the frame openings 5. A sloped wall of asymmetrical frame opening 5 can be obtained by exceeding photolithography resolution limits so a mask produces less than a well defined print image during photolithography. A three-dimensional profile of a frame opening 5 can be designed to alter multiple aspects of a microlens shape or optical properties such as focal characteristics, for example focal length and focal point. Three-dimensional modeling and designs for microlenses can be produced by use of commercial and proprietary optical property modeling tools that simulate optical characteristics of microlenses, such as Lighttools®. Other tools are available to provide modeling of flow/reflow behavior of microlenses during heating processing. Together, the tools can be used to predict how different three-dimensional designs of frame openings, as well as other structures affecting microlens material flow, alter microlens shapes and optical properties.

Figure 14:
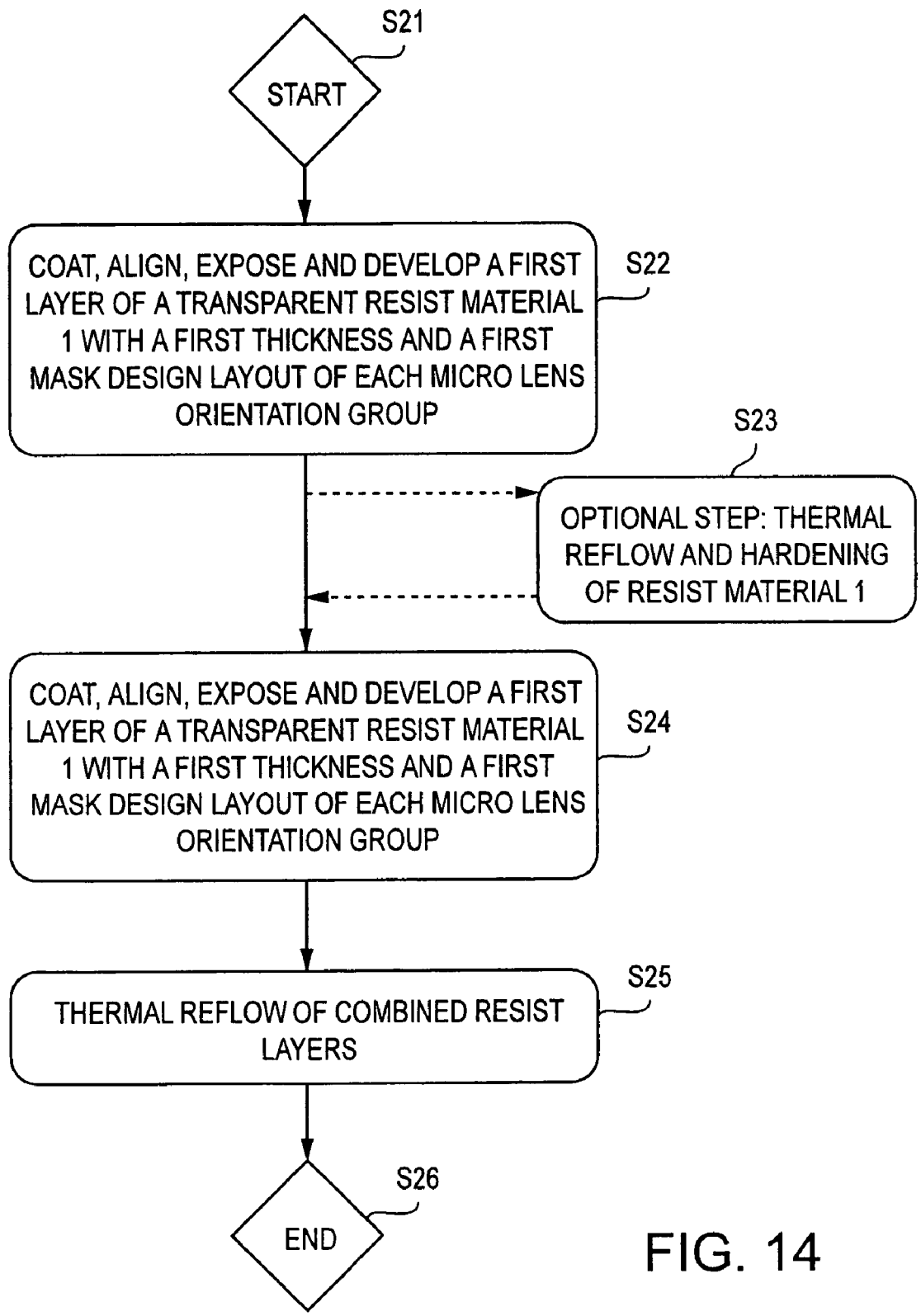
FIG. 14 illustrates a flow chart for a method of manufacturing a microlens structure in accordance with an exemplary embodiment of the invention.

An exemplary process for manufacturing exemplary embodiments of the invention, such as the ones shown in FIGS. 1-13, is shown in FIG. 14. At processing segment S21, a plurality of pixels including at least one photosensitive element are formed in a substrate. At processing segment S22, a transparent resist layer of a first material is formed over the plurality of pixels. A plurality of asymmetrical containing structures are formed from the transparent resist layer of the first material, by exposing and developing the transparent resist layer according to a first mask design layout of each microlens orientation group. The asymmetrical containing structures comprise a plurality of sidewalls formed over the plurality of pixels, the plurality of containing structures defining an outer boundary of the microlens structure. Optionally, at processing segment S23, the asymmetrical containing structures are thermally reflowed to harden the transparent resist layer of the first material. At processing segment S24, a transparent resist layer of a second material is formed over the asymmetrical containing structures by employing a second mask design layout so that, at processing segment S25, tilted microlenses are formed by thermally reflowing the combined resist layers. In this manner, lens material comprising the second material is formed within each of the asymmetrical containing structures, the sidewalls of which exerting a force on the lens material during a liquid-phase of the lens material that alters the lens orientation during the liquid-phase of the lens material. Additional processing steps to complete the formation of the imager comprising at least one tilted microlens, such as the tilted microlens 100 of FIG. 8, may be conducted at processing step S26.

Figure 15:
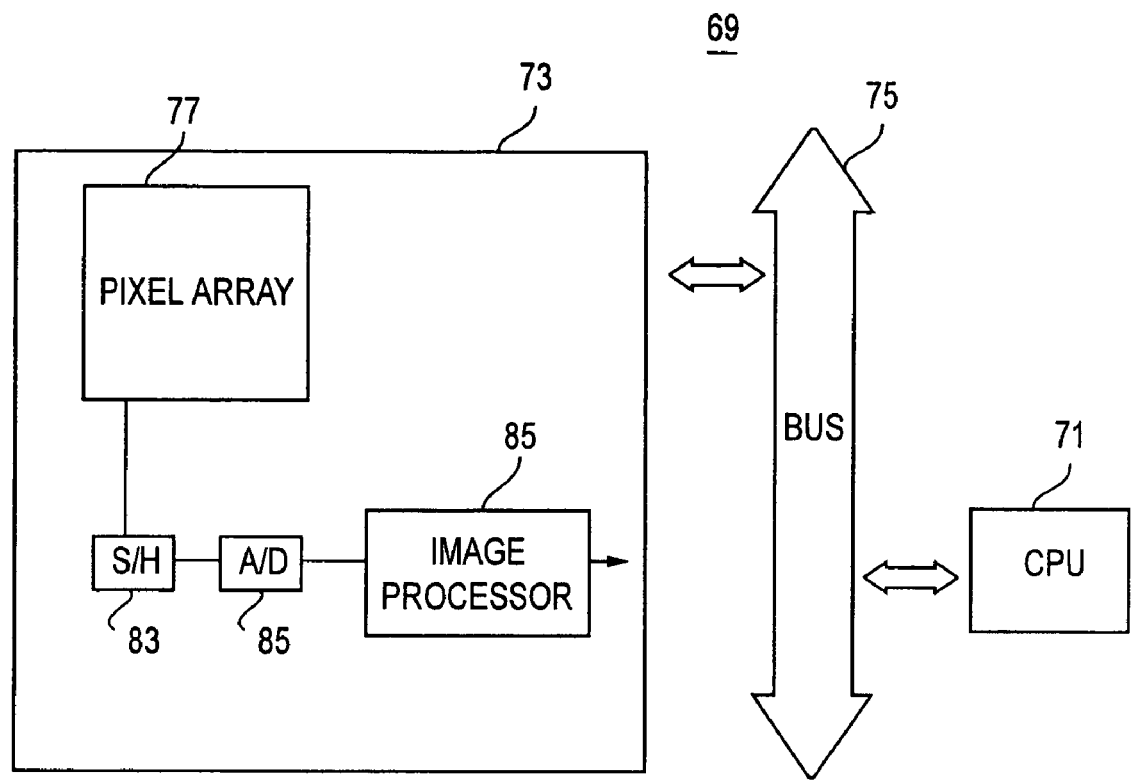
FIG. 15 illustrates an image processing system constructed in accordance with an exemplary embodiment of the invention.

A system 69 comprising an imager 73 with a pixel array 77 comprising at least one tilted microlens structure fabricated in accordance with any of the embodiments of the invention is illustrated in FIG. 15. The system 69 is coupled with a sample and hold circuit 83. An analog to digital (A/D) 85 receives signals from the sample and hold circuit 83 and outputs digital signals to an image processor 85. The imager 71 then outputs image data to a data bus 75. A central processing unit coupled to the data bus 75 receives image data.

Although the embodiments illustrated above have been described with reference to particular examples of asymmetrical frame structures for fabrication of tilted microlenses, it must be understood that a variety of sidewall shapes and structure configurations may be employed in accordance with the invention. In addition, it is also possible to form a microlens layer relative to a frame layer to allow additional influences, such as a non-equilibrium based design parameter, on a final orientation of the completed microlens. For example, a tilted microlens can be formed based on non-equilibrium flow conditions such as heating a lens material such that it begins a phase change to a liquid and begins flowing, then allow the lens material to solidify during the flow process before it reaches its final equilibrium shape as defined by surface and volume forces. Such non-equilibrium based design influences provide additional means for defining a final orientation of a microlens.

Frame material can be transparent with a certain refractive index to help guide incident light onto a photosensor, for example a photodiode. Frame material can also be absorbing to act as a black matrix outer containment layer. Transparent material or light absorbing material embodiments would aid in reducing crosstalk. In addition, although the invention has been described with reference to the formation of a convex shaped tilted microlens, the invention also applies to the formation of concave shaped tilted microlenses.

While exemplary embodiments of the invention have been described and illustrated, it should be apparent that many changes and modifications can be made without departing from the spirit or scope of the invention. Accordingly, the invention is not limited by the description above, but is only limited by the scope of the appended claims.

The invention claimed is:

1. A lens structure for an imager, comprising:
   a plurality of asymmetrical frames each for defining a boundary of a liquid lens material prior to hardening; and
   a hardened lens material with sufficient volume to completely fill at least one of said asymmetrical frames and extend beyond a plane enclosing the top of said asymmetrical frames, said hardened lens material being hardened from said liquid state.

2. The lens structure of claim 1, wherein at least one sidewall of the asymmetrical frame has a cross-sectional width different from cross-sectional widths of the other sidewalls of the asymmetrical frame.

3. The lens structure of claim 1, wherein the asymmetrical frame has four sidewalls.

4. The lens structure of claim 3, wherein the four sidewalls form a substantially trapezoidal cross-sectional shape.

5. The lens structure of claim 1, wherein the asymmetrical frame has at least first, second, and third sidewalls, at least two of the sidewalls having sloped sidewalls in cross-section.

6. The lens structure of claim 1, wherein the plurality of asymmetrical frames includes at least first and second adjacent asymmetrical frames, and wherein the first and second adjacent asymmetrical frames share a sidewall having at least two surfaces, each of said two surfaces defining a boundary for said liquid lens material.

7. The lens structure of claim 6, wherein the first and second asymmetrical frames each have respective first and second lens materials, the first and second lens materials each having respective first and second non-zero degree angles, said non-zero degree angles measured from a horizontal axis of a plurality of pixels.

8. The lens structure of claim 7, wherein a degree measure of the first non-zero degree angle and a degree measure of the second non-zero degree angle are equal.

9. The lens structure of claim 7, wherein a degree measure of the first non-zero degree angle and a degree measure of the second non-zero degree angles are unequal.

10. The lens structure of claim 1, wherein the hardened lens structure has a convex shape.

11. The lens structure of claim 1, wherein the hardened lens structure has a concave shape.

12. A lens structure, comprising:
a plurality of frames each having an asymmetrical cavity that defines a boundary of a liquid lens material prior to hardening; and
a hardened lens material with sufficient volume to completely fill said asymmetrical cavity and extend beyond a top most surface of said asymmetrical cavity, said hardened lens material being hardened from said liquid state.

13. The lens structure of claim 12, wherein at least one frame has at least one sidewall having a cross-sectional width different from cross-sectional widths of the other sidewalls of the frame.

14. The lens structure of claim 12, wherein the frame has four sidewalls.

15. The lens structure of claim 12, wherein the frame has at least first, second, and third sidewalls, at least two of the sidewalls having sloped sidewalls in cross-section.

16. The lens structure of claim 12, wherein the plurality of frames includes at least first and second adjacent frames, and wherein the first and second adjacent asymmetrical frames share a sidewall having at least two surfaces, each of said two surfaces defining a boundary for said liquid lens material for the first and second adjacent frames, respectively.

* * * * *

UNITED STATES PATENT AND TRADEMARK OFFICE
CERTIFICATE OF CORRECTION

PATENT NO. : 7,280,279 B2
APPLICATION NO. : 11/328158
DATED : October 9, 2007
INVENTOR(S) : Boettiger et al.

Page 1 of 1

It is certified that error appears in the above-identified patent and that said Letters Patent is hereby corrected as shown below:

In column 8, line 42, in Claim 1, delete "frames," and insert -- frame, --, therefor.

In column 9, line 6, in Claim 9, delete "angles" and insert -- angle --, therefor.

Signed and Sealed this

Eighteenth Day of December, 2007

JON W. DUDAS
*Director of the United States Patent and Trademark Office*